US005622768A

United States Patent [19]

Watanabe et al.

[11] Patent Number: 5,622,768

[45] Date of Patent: Apr. 22, 1997

[54] MAGNETIC CORE

[75] Inventors: Yumie Watanabe, Tokyo-To; Yumiko Takahashi, Koshigaya; Takao Sawa; Yoshiyuki Yamauchi, both of Yokohama; Susumu Matsushita, Yokosuka; Masami Okamura, Yokohama, all of Japan

[73] Assignee: Kabushiki Kaishi Toshiba, Kawasaki, Japan

[21] Appl. No.: 238,332

[22] Filed: May 4, 1994

Related U.S. Application Data

[63] Continuation of Ser. No. 793,347, filed as PCT/JP90/00407 Mar. 27, 1990, abandoned.

[51] Int. Cl.$^6$ .............................. B32B 3/10; H03K 3/00; H01F 27/24

[52] U.S. Cl. .......................... 428/141; 428/606; 428/692; 428/900; 307/106; 307/415; 336/213; 335/297; 148/304; 148/403

[58] Field of Search .................................... 428/692, 606, 428/900, 141; 307/106, 415; 336/213; 335/297; 148/304, 403

[56] References Cited

U.S. PATENT DOCUMENTS

| | | | |
|---|---|---|---|
| 4,859,256 | 8/1989 | Sawa et al. | 148/304 |
| 4,871,925 | 10/1989 | Yamauchi et al. | 307/106 |
| 4,958,134 | 9/1990 | Sawa et al. | 333/185 |

FOREIGN PATENT DOCUMENTS

| | | |
|---|---|---|
| 0342921 | 11/1989 | European Pat. Off. . |
| 0342922 | 11/1989 | European Pat. Off. . |
| 0342923 | 11/1989 | European Pat. Off. . |
| 58-44702 | 3/1983 | Japan . |

OTHER PUBLICATIONS

Japanese Journal of Applied Physics, vol. 19, No. 9, Sep. 1980, pp. 1781–1787, Matsuura, et al.

Materials Letters, vol. 7, No. 7–8, Dec. 1988; pp. 263–267, Pang et al.

Patent Abstracts of Japan, vol. 9, No. 277 (E–355)[2000], Nov. 6, 1985; & JP–A–60 121 706.

Patent Abstracts of Japan, vol. 10, No. 175 (E–413) [2231], Jun. 20, 1986; & JP–A–61 24 208.

Patent Abstracts of Japan, vol. 13, No. 589 (C–670)(3937), Dec. 25, 1989; & JP–A–1247556.

Patent Abstracts of Japan, vol. 13, No. 171, (C–588)(3519), Apr. 24, 1989 & JP–A–64 249.

Journal of Applied Physics, vol. 55, No. 6, part IIA, Mar. 1984, pp. 1787–1789.

Patent Abstracts of Japan, vol. 13, No. 139 (E–738)(3487), Apr. 6, 1989 & JP–A–63302504.

*Primary Examiner*—Leszek Kiliman

*Attorney, Agent, or Firm*—Foley & Lardner

[57] ABSTRACT

A magnetic core is obtained by winding or laminating at least one alloy ribbon and has excellent squareness characteristic and magnetic saturation characteristic in a high frequency region wherein the squareness ratio of the magnetic core is improved by restricting the surface roughness of the alloy ribbon to specific regions.

9 Claims, 4 Drawing Sheets

MAGNETIC CORE

This application is a continuation of application Ser. No. 07/793,347, filed Jan. 13, 1992, now abandoned, which is the National Phase of PCT/JP90/00407 filed Mar. 27, 1990.

TECHNICAL FIELD

This invention relates to a magnetic core suitable for magnetic components such as saturable reactors and reactors for semiconductor circuits used in high frequency switching power sources wherein the magnetic core has excellent squareness ratio characteristic and magnetic saturation characteristic particularly at a high frequency (specifically, at least 50 kHz) and has a low core loss, and to an alloy ribbon used in the production of such a magnetic core.

BACKGROUND ART

In recent years, there has been a need to develop magnetic components having high performance suitable for use as important functional components as electronic equipment having a small size, light weight and high performance. In particular, in switching power sources used as power sources of OA equipment and communication equipment, high frequency is required due to the requirement of small size and light weight. Accordingly, magnetic materials used in these magnetic components must have excellent high frequency magnetic characteristics. In particular, materials having high permeability are effective for many magnetic components such as residual current transformers, current sensors and noise filters.

In recent years, switching power sources having magnetic amplifiers incorporated therein have been widely used from the standpoints of high reliability and high efficiency.

The main part constituting the magnetic amplifier is a saturable reactor, and magnetic materials having excellent squareness and magnetization characteristics are required. Heretofore, Sendelta (tradename) composed of an Fe-Ni crystalline alloy has been used as such a magnetic material.

While Sendelta has excellent squareness magnetization characteristics, its coercive force is increased at a high frequency of 20 kHz or higher and its eddy-current loss is increased to generate heat, whereby Sendelta becomes unusable. Therefore, the switching frequency of the switching power source having a magnetic amplifier incorporated therein is restricted to no more than 20 kHz.

In recent years, there has been a demand for switching power sources having higher switching frequency in addition to small size and light weight. Japanese Patent Laid-Open Publication No. 225804/1986 discloses an amorphous alloy suitable for use as a magnetic material having a small coercive force at a high frequency and excellent squareness characteristic and heat stability.

In order to meet requirements of high efficiency of the switching power source, it is necessary to provide an amorphous alloy magnetic core having high performance, and particularly it is desirable that the squareness ratio and magnetic saturation characteristic (e.g., the reduction in saturation inductance) of magnetic amplifiers used at a frequency of at least 50 kHz be further improved.

DISCLOSURE OF THE INVENTION

The present invention has been made with consideration of the above described problems.

An object of the present invention is to provide a magnetic core obtained by using an alloy ribbon having a large squareness ratio particularly at a high frequency and a small saturation inductance.

The magnetic core of the present invention is a magnetic core formed by winding or laminating at least one alloy ribbon and having excellent squareness characteristic in a high frequency region wherein the squareness ratio of the magnetic core is improved by setting the percent area occupation of concavities formed on the surface of the roll side of said alloy ribbon to no more than 30%.

We have found that not only the squareness ratio in a high frequency region can be rapidly improved, but also the saturation inductance can be reduced by setting the percent area occupation of concavities formed on the surface of the roll side of the alloy ribbon to no more than 30%. Further, we have found that the squareness characteristic of the magnetic core particularly in a high frequency region can be improved by setting the percent area occupation of a concave formed on the surface of the roll side of the alloy ribbon to no more than 30% and simultaneously setting the surface roughness (Rf) of the free side of the alloy ribbon constituting the magnetic core to no more than 0.3%. The present invention has been achieved on the basis of the findings described above.

According to the present invention, there is provided a magnetic core having a squareness ratio of 96%, preferably at least 98%, more preferably at least 98.5% and most preferably at least 99% at a frequency of 100 kHz. Further, according to the present invention, there is provided a magnetic core having a saturation magnetic characteristic of no more than 550 G, preferably no more than 500 G. Herein, the saturation magnetic characteristic ordinarily varies depending upon the shape of the magnetic core, the number of turns and measurement conditions. In the present invention, the saturation characteristic is expressed by the difference between a magnetic flux density obtained by applying a magnetic field of 16 Oe to the following magnetic core under the following conditions and residual magnetic flux density: (i) magnetic core having an outer diameter of 15 mm, an inner diameter of 10 mm and a height of 4.5 mm; (ii) number of turns of 10; and (iii) measurement conditions: frequency of 100 kHz.

BEST MODE FOR CARRYING OUT THE INVENTION

Figure 1:
FIGS. 1 and 2 are scanning electron microscope photomicrographs showing the surface state of an alloy ribbon according to the present invention.

In recent years, soft magnetic alloy ribbons used in magnetic materials used at a high frequency have been produced in many cases by a so-called melt quenching method. In this method, ribbons are obtained by melting an alloy in a heat-resistant vessel such as quartz, ejecting the molten alloy having a specific composition from a nozzle onto the rotating surface of a metal cooling roll which is rotating at a high velocity and quenching it. However, fine concavities and convexities are inevitably formed on the surface (the roll-contacting surface, i.e., the side which comes into contact with the cooling roll) of the thus obtained alloy ribbon.

We have now found that not only the squareness ratio in a high frequency region can be rapidly improved, but also the saturation inductance can be reduced by strictly restricting the percent area occupation of the concavities present in the surface of the roll side of the alloy ribbon to no more than 30%, preferably no more than 25%, and more preferably no more than 20%.

That is, the present magnetic core according to a first embodiment of the invention is formed from an alloy ribbon produced by ejecting an alloy melt onto the surface of a cooling roll by means of a nozzle and quenching alloy melt wherein the alloy ribbon is such that the percent area occupation of the concavities formed in the alloy ribbon surface contacting said cooling roll is no more than 30%.

When the alloy ribbon is produced by the melt quenching method, the surface state of the resulting alloy ribbon primarily depends upon the surface state of the cooling roll and wettability between the molten alloy and the roll. This wettability is also affected by the composition of the alloy. The concavities formed in the surface of the alloy ribbon is formed by bubbles trapped between the cooling roll and the molten metal.

As can be seen from the results of the Examples described hereinafter, according to the present invention, the squareness ratio of the magnetic core can be remarkably improved by restricting the percent area occupation of the concavities formed in the alloy ribbon surface contacting the cooling roll to no more than 30%.

The improvement in the squareness ratio as described above is particularly remarkable in the case of an amorphous alloy having a Curie temperature of no more than 300° C. This is believed to be due to the proportion of the induced magnetic anisotropy generated by heat treatment and the proportion of magnetic shape anisotropy attributable to the surface roughness. That is, a remarkable effect is obtained in the case of an alloy having a Curie temperature of no more than 300° C. and a relatively small induced magnetic anisotropy.

The methods of restricting the percent area occupation of the concavities formed in the surface of the ribbon to no more than 30% as described above include a method of improving the wettability between the cooling roll and the alloy melt and a method of realizing the optimum cooling rate. Examples of such methods include a method of using Fe-base rolls (e.g., S45C, high-speed steel), a method of controlling the temperature of water cooling from the interior of a cooling roll to 30° to 60° C. in the case of Cu-base alloys (CuBe, CuTi or the like) and a method of controlling the ejection temperature of the alloy melt to at least 1350° C.

A further preferred method is a method wherein the pressure of the production atmosphere is reduced to a value less than atmospheric pressure. In this method, the generation of the concavities can be reduced (e.g., to no more than 10%).

The definition and measurement method of "the percent area occupation of the concavities formed in the surface of the ribbon" as used herein are as follows:

A photomicrograph of the roll-contacting surface is taken by means of a scanning electron microscope at a magnification of 200. The concavities having a field major axis (diameter of a minimum circle including said concavities and contacting therewith) of at least 10 micrometers are all picked up, and the area ratio occupied by the concavities per unit area is determined by an image treatment apparatus (e.g., LUZEX500 manufactured by Nippon Regulator K.K., Japan). This process is repeated at least 10 times. The average value is determined, and this average value is referred to as "percent area occupation".

A second example of controlling the surface roughness of an alloy ribbon will now be described.

That is, the second embodiment of the present invention is an alloy ribbon produced by ejecting an alloy melt onto the surface of a cooling roll by means of a nozzle and quenching the alloy melt, wherein a magnetic core is formed by at least one alloy ribbon in which the surface roughness of the alloy ribbon surface which does not come into contact with said cooling roll has, in the longitudinal direction of said alloy ribbon, a value represented by the equation:

$$Rf \leqq 0.3$$

wherein Rf is a parameter characterizing a roughness determined by the following equation:

$$Rf = Rz/T$$

wherein Rz represents the average roughness of ten points at a standard length of 2.5 mm stipulated in JIS-B-0601 and T represents the average plate thickness determined by the weight of the alloy ribbon. The value of Rf is preferably no more than 0.25, more preferably no more than 0.22.

When the alloy ribbon is produced by the melt quenching method, ordinarily, the surface state of the resulting alloy ribbon is affected by the conditions such as the surface state of the cooling roll and the stability of melt reservoir occurring between the nozzle and the roll. We have found that the concavities and convexities periodically appearing in the longitudinal direction of the ribbon on the free surface (i.e., the ribbon surface which does not come into contact with the cooling roll) (so-called fish scale) adversely affect the high frequency magnetic characteristics, particularly the squareness ratio of the alloy ribbon.

That is, not only can the squareness ratio in a high frequency region be remarkably improved, but also the saturation inductance can be reduced by restricting the longitudinal surface roughness of the alloy ribbon to a specific value, $Rf \leqq 0.3$, more preferably $Rf \leqq 0.27$ according to the stipulation described above.

Such an effect is particularly remarkable when an amorphous alloy having a Curie temperature of no more than 300° C. is used as a material. It is believed that the shape anisotropy attributable to the surface roughness participates as described in the case of the roll-contacting surface of the ribbon.

In order to control the surface roughness as described above, it is necessary to suitably control production parameters such as the material from which the cooling roll is produced, the roll surface temperature and the temperature of the melt during the injection process. For this purpose, it is necessary to adjust or optimize the cooling rate and the peripheral speed of the roll. Specifically, a method wherein a Cu-base alloy roll is used and the water temperature in the interior of a roll is set at 30° to 80° C. and a method wherein the peripheral speed of the roll is set at at least 25 m/s are effective.

Alloy materials used in the magnetic core of the present invention will now be described.

Co-base amorphous alloys and Fe-base magnetic alloys can be used in the present invention.

The preferred composition of the Co-base amorphous alloys is represented by the following general formulae:

$$(Co_{1-a}Fe_a)_{100-x}(Si_{1-l}B_l)_x \quad (i)$$

wherein $0.02 \leqq a \leqq 0.08$ $0.3 \leqq l \leqq 0.8$ $26 \leqq x \leqq 32$ (at. %)

$$(Co_{1-b-c}Fe_bM_c)_{100-y}(Si_{1-m}B_m)_y \quad (ii)$$

wherein M is selected from the group consisting of Ni, Mn and combinations thereof, $b \leqq 0.10$ $0.01 \leqq c \leqq 0.10$ $0.3 \leqq m \leqq 0.8$ $26 \leqq y \leqq 32$ (at. %)

$$(Co_{1-d-e}Fe_dM'_e)_{100-z}(Si_{1-n}B_n)_z \quad (iii)$$

wherein M' is selected from the group consisting of Ti, V, Cr, Cu, Zr, Nb, Mo, Hf, Ta, W and combinations thereof, $0.03 \leqq d \leqq 0.10$ $0.01 \leqq e \leqq 0.06$ $0.3 \leqq n \leqq 0.8$ $24 \leqq z \leqq 32$ (at. %)

$$(Co_{1-f-g-h}Fe_fM_gM'_h)_{100-w}(Si_{1-p}B_p)_w \quad (iv)$$

wherein M is selected from the group consisting of Ni, Mn and combinations thereof, $f \leqq 0.10$ $0.01 \leqq g \leqq 0.10$ $0.01 \leqq h \leqq 0.08$ $0.3 \leqq p \leqq 0.5$ $24 \leqq w \leqq 30.$ (at. %)

Co-base amorphous alloys having a saturation magnetostriction constant λs falling within the range of $-1\times10^{-6} \leqq \lambda s \leqq 1\times10^{-6}$ are preferred.

While the Co-base amorphous alloys used in the magnetic core of the present invention are represented by the four general formulae described above, the most important requirement resides in the composition for setting the Curie temperature to no more than 300° C. The atomic ratio of metal element to metalloid element is important. In the general formulae (i) and (ii), x, y and z are from 26 to 32 at. %. In the general formulae (iii) and (iv), w is from 24 to 30 at. %. If x, y and z are less than 26 at. % or if w is less than 24 at. %, the coercive force will be large; the value of the core loss will be large; and the heat stability will be poor. If x, y and z are more than 32 at. %, or if w is more than 30 at. %, the Curie temperature will be reduced and thus the magnetic core will become impractical.

Fe is an element for adjusting the magnetostriction to within the range of $-1\times10^{-6}$ to $+1\times10^{-6}$. When a, b, d and f showing the amount of Co which varies depending upon the amount of Ni and Mn added, the amount of the non-magnetic transition metal element added and the value of Si and B are stipulated to from 0.02 to 0.08, no more than 0.10, from 0.03 to 0.10 and no more than 0.10, respectively, the desired magnetostriction can be realized.

M (selected from the group consisting of Ni, Mn and combinations thereof) and M' (selected from the group consisting of Ti, V, Cr, Cu, Zr, Nb, Mo, Hf, Ta, W and combinations thereof) are elements that are effective for improving the heat stability. Their amounts c and h are no more than 0.10 and no more than 0.08, respectively. If c and h are more than 0.10 and more than 0.08, respectively, the Curie temperature will be excessively reduced, whereby such amounts will be undesirable.

Si and B are essential components for obtaining amorphous alloys. In particular, in order to obtain magnetic cores having low core loss, high squareness ratio and high heat stability, it is necessary that l, m, n or p showing the amounts of Si and B are stipulated at from 0.3 to 0.5 and that the alloy is rich in Si. If l, m, n and p are less than 0.3 or more than 0.5, it will be difficult to obtain a high squareness ratio, and the heat stability of magnetic characteristic will be slightly reduced.

Among the alloys (i) to (iv) described above, the alloys (iii) and (iv) are the most preferred from the standpoints of the reduction of the concavities due to the trapping of the bubbles (first embodiment of the present invention). More preferably, Cr, Nb or Mo is selected as M'. It is believed that such an element contributes to the improvement of wettability and the reduction in viscosity.

In the cases of the first and second embodiments of the present invention, the magnetic shape anisotropy effect is obtained in the case of low induced magnetic anisotropy. Accordingly, the present invention is particularly effective for materials having an induced magnetic anisotropy of no more than $10^4$ ergs/cc. As described above, the present invention exhibits a remarkable effect in the case of amorphous alloys having a Curie temperature of no more than 300° C. If the Curie temperature is less than 160° C., the squareness ratio and saturation inductance will not reach a good level. Accordingly, in the present invention, the Curie temperature is within the range of 160° to 300° C., preferably within the range of 180° to 280° C., and more preferably from 190° to 270° C.

The Curie temperature of no more than 300° C. is necessary for improving heat stability. In general, it is known that amorphous alloys can be obtained by quenching an alloy stock having a specific composition from the molten state at a cooling rate of at least $10^4$ °C./s (liquid quenching method). The amorphous alloy of the present invention can be readily produced in the conventional manner described above. This amorphous alloy is used, for example, as a plate-shaped ribbon produced by a single roll method. In this case, if the thickness is more than 25 micrometers, the core loss at a high frequency will be increased. Accordingly, it is preferable that the thickness of the ribbon be set within the range of 5 to 25 micrometers.

The magnetic core of the present invention is produced by winding the amorphous alloy produced by the production method described above in a specific shape and heat treating to remove strains. The cooling rate is desirably of the order of 0.5° to 50° C./minute, preferably within the range of 1° to 20° C./minute. The heat treatment may be carried out in a magnetic field at a temperature less than the Curie temperature.

On the other hand, an Fe-base ultramicrocrystalline alloy can be used in the present invention. This alloy is obtained by adding Cu and one of Nb, W, Ta, Zr, Hf, Ti and Mo to alloys such as an Fe-Si-B alloy, forming the mixture into a ribbon as with the amorphous alloy, and heat treating at a temperature above its crystallization temperature to deposit fine grains.

The present invention can be applied to the Fe-base ultramicrocrystalline alloy as described above.

The composition of the alloy used in producing an Fe-base soft magnetic alloy ribbon as described above includes the following composition represented by the following formula:

$$Fe_{100-e-f-g-h-i-j}E_eG_fJ_gSi_hB_iZ_j \quad (II)$$

wherein: E represents an element selected from the group consisting of Cu, Au and combinations thereof; G represents an element selected from the group consisting of an element of the group IVa, an element of the group Va, an element of the group VI'a, rare earth elements, and combinations thereof; J represents an element selected from the group consisting of Mn, Al, Ga, Ge, In, Sn, platinum group metals, and combinations thereof; Z represents an element selected from the group consisting of C, N, P and combinations thereof; and e, f, g, h, i and j are numbers satisfying the following equations:

$$0.1 \leqq e \leqq 8$$

$$0.1 \leqq f \leqq 10$$

$$0 \leqq g \leqq 10$$

$$12 \leqq h \leqq 25$$

$$3 \leqq i \leqq 12$$

$$0 \leqq j \leqq 10$$

$$15 \leqq h+i+j \leqq 30$$

wherein all numerical quantities in the equations represent atomic %.

Herein, E in the formula (II) given above (Cu or Au) is an element effective for enhancing the corrosion resistance, for preventing the coarsening of grains and for improving soft magnetic characteristics such as core loss and permeability. Such an element is particularly effective for depositing a bcc phase at a low temperature. If the amount of such an element is too small, the effect as described above cannot be obtained. If the amount is too large, the magnetic characteristics will deteriorate, and therefore such an amount is undesirable. Therefore, the content of E is suitably within the range of 0.1 to 8 atomic %. The preferred range is from 0.1 to 5 atomic %.

G (an element selected from the group consisting of an element of the group IVa, an element of the group Va, an element of the group VIa, rare earth elements, and combinations thereof) is an element which is effective for homogenization of grain size, which is effective for reducing magnetostriction and magnetic anisotropy and which is effective for the improvement of soft magnetic characteristic and the improvement of magnetic characteristic with respect to the temperature change. When G is used in combination with E (e.g., Cu), the bcc phase can be stabilized within the wider ranges. If the amount of G is too small, the effect described above cannot be obtained. If the amount is too large, non-crystallization cannot be achieved in the production process, and the saturation magnetic flux density will be reduced. Therefore, the content of G is suitably within the range of 0.1 to 10 atomic %. The more preferred range is from 1 to 8 atomic %.

In addition to the effect described above, each element in E is effective for improving respective properties. The group IVa element is effective for enlarging the heat treatment conditions for obtaining optimum magnetic characteristic. The group Va element is effective for improving embrittlement resistance and workability such as cutting. The group VIa element is effective for improving the corrosion resistance and surface properties.

Among these, Ta, Nb, W, Mo and V are particularly preferred. Ta, Nb, W and Mo are effective for improving soft magnetic characteristic. V is effective for improving embrittlement resistance and surface properties.

J (an element selected from the group consisting of Mn, Al, Ga, In, Sn, platinum group metals, and combinations thereof) is an element effective for improving soft magnetic characteristic or corrosion resistance. If the amount of J is too large, the saturation magnetic flux density will be reduced. Therefore, the amount of J is no more than 10 atomic %. Among these, Al is an element effective for improving refinement of grains and magnetic characteristic and for stabilizing the bcc phase. Ge is an element effective for stabilizing the bcc phase. The platinum group metals are elements effective for improving the corrosion resistance.

Si and B are elements aiding in the amorphrization of an alloy during the production process. These can improve the crystallization temperature and are elements effective for heat treatment for improving magnetic characteristic. In particular, Si forms a solid solution together with Fe which is a principal component of fine grains, and contributes to reduction in magnetostriction and magnetic anisotropy. If the amount of Si is less than 12 atomic %, the improvement of soft magnetic characteristic will be insufficient. If the amount of Si is more than 25 atomic %, the ultraquenching effect will be small, relatively coarse grains of micrometer size will deposit, and good soft magnetic characteristic cannot be obtained. It is particularly preferable that Si be from 12 to 22 atomic % from the standpoint of the development of super lattice. If the amount of B is less than 3 atomic %, relatively coarse grains will deposit and thus good characteristics cannot be obtained. If the amount of B is more than 12 atomic %, a B compound will be liable to deposit by the heat treatment and soft magnetic characteristic will deteriorate.

Z (C, N, P) are included in an amount of no more than 10 atomic % as other amorphrization elements.

The total amount of Si, B and other non-crystallizable elements is preferably within the range of 15 to 30 atomic %. $Si/B \geqq 1$ is preferred for obtaining excellent soft magnetic characteristic.

In particular, the use of the amount of Si of 13 to 21 atomic % provides the magnetostriction $\lambda s \cong 0$, and the deterioration of magnetic characteristic due to a resin mold is prevented. Thus, the desired excellent soft magnetic characteristic can be effectively obtained.

Even if the Fe-base soft magnetic alloy contains minor amounts of incidental impurities such as O and S contained in conventional Fe alloys, the effect of the present invention is not impaired.

Examples of the present invention will be described hereinafter.

EXAMPLE A1 AND COMPARATIVE EXAMPLE A1

Continuous ribbon samples a and b having a plate thickness of 16 micrometers and a width of 10 mm and having different surface properties of the roll-contacting surface were prepared from an amorphous alloy represented by the formula:

$(Co_{0.900}Fe_{0.05}Nb_{0.05}Cr_{0.02})_{75}(Si_{0.56}B_{0.44})_{25}$ by a single roll method.

Figure 2:
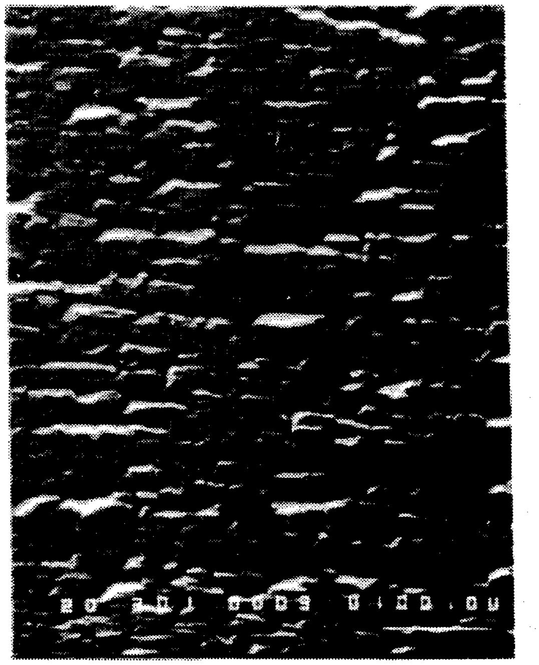

Trapping of bubbles in the roll-contacting surface of Samples a and b were observed by photographs, and the difference as shown in FIG. 1 and FIG. 2 was observed. The proportion was 38% for Sample a (FIG. 1) and 23% for Sample b (FIG. 2).

The measurement of the percent area of concavities was carried out as follows. First, a scanning electron microscope was used to take a photomicrograph of the roll-contacting surface of a ribbon at a magnification of 200. In this photograph, a concavity having a major axis of at least 10 micrometers was extracted within a field of 0.45 mm×0.55 mm, and image treatment was carried out to determine the area. This was compared with the total field area to determine the percent area of concavities.

The resulting alloy ribbon was wound to form a toroidal core having an outer diameter of 18 mm and an inner diameter of 12 mm. This was then heat treated at a suitable temperature above the Curie temperature and below the crystallization temperature, and thereafter cooled at a rate of 4° C./minute.

Primary and secondary windings were applied to the core thus obtained, and an external magnetic field of 1 Oe was applied. An alternating-current magnetization meter was used to measure the alternating-current hysteresis loop and the squareness ratio of Br/Bl (Br: remanent magnetic flux density and Bl: magnetic flux density at a magnetic field of 1 Oe). The value at 100 kHz was 99.4% for a magnetic core obtained by using the material shown in FIG. 1 and 94.8% for the material shown in FIG. 2. The difference therebetween was about 5%.

When these magnetic cores were used as saturable reactors at a power source having a switching frequency of 100 kHz, the magnetic core of the present Example obtained by using the ribbon shown in FIG. 1 exhibited a smaller output uncontrollable range (dead angle) as compared with a comparative magnetic core obtained by using the ribbon shown in FIG. 2. The efficiency was also improved by about 2%.

EXAMPLE A2

Ribbon samples having various surface properties were prepared from an amorphous alloy having the composition represented by the formula:

$(Co_{0.90}Fe_{0.05}Mn_{0.02}Nb_{0.03})_{75}Si_{13}B_{12}$ by a single roll method.

Figure 3:
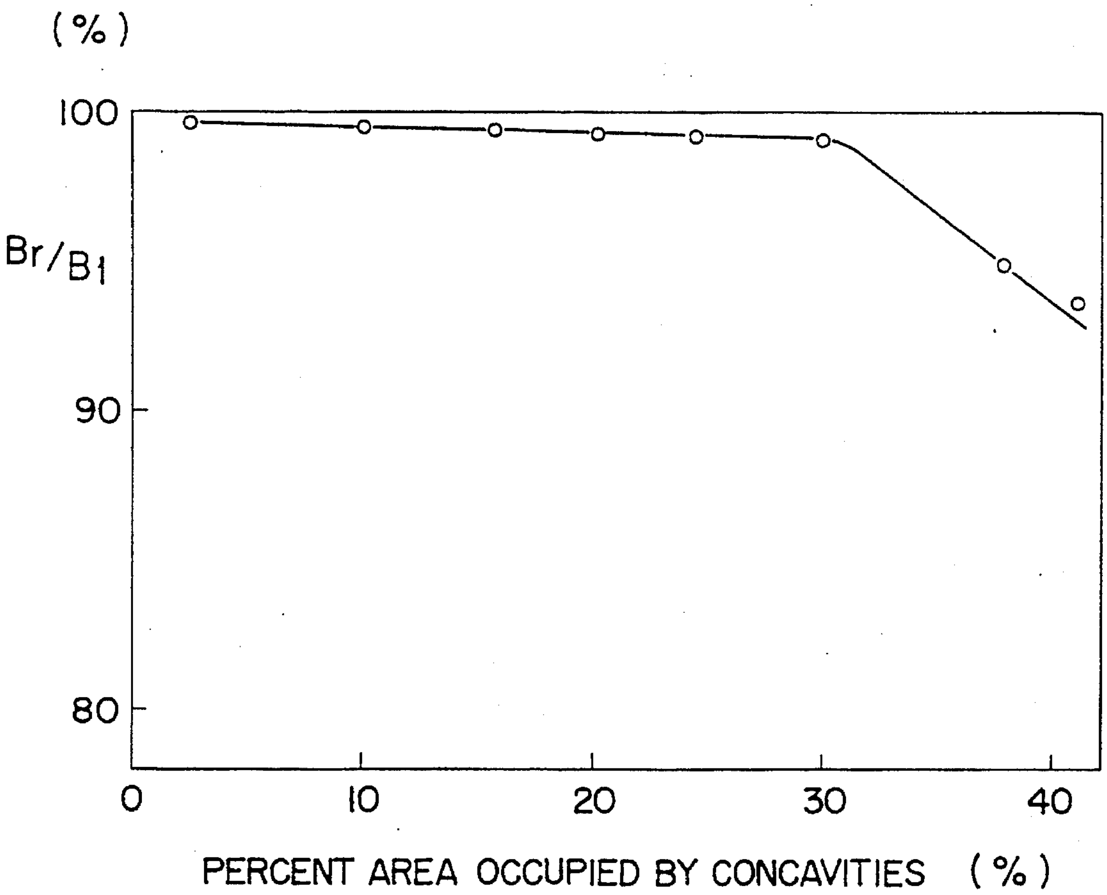
FIG. 3 is a graph showing the relationship between the percent area occupation of concavities formed on the surface of an alloy ribbon and the squareness ratio.

These materials were formed into magnetic cores as in Example A1, and the relationship between the percent area occupation and squareness ratios at a high frequency was examined. The results are summarized in FIG. 3. It turned out that when the area occupation is more than 30%, the squareness ratio rapidly deteriorates.

In the following Examples and Comparative Examples, the percent area occupation of the concave of the roll-contacting surface was measured as in Example A1 described above.

EXAMPLE B1 AND COMPARATIVE EXAMPLE B2

Continuous ribbon samples a and b having a plate thickness of 16 micrometers and a width of 10 mm and having different surface properties of the roll-contacting surface were prepared from an amorphous alloy represented by the following formula:

$(Co_{0.94}Fe_{0.05}Nb_{0.01})_{71}(Si_{0.6}B_{0.4})_{29}$ by a single roll method.

The longitudinal surface roughness of Samples a and b was measured by means of a surface roughness meter. When the surface roughness is expressed by Rf, the Rf of Samples a and b are 0.15 and 0.38, respectively. The resulting alloy ribbon was wound to form a toroidal core having an outer diameter of 18 mm and an inner diameter of 12 mm. This was then heat treated at a suitable temperature above the Curie temperature and below crystallization temperature, and thereafter cooled at a rate of 4° C./minute.

Primary and secondary windings were applied to the core thus obtained, and external magnetic field of 1 Oe was applied. An alternating-current magnetization meter was used to measure the alternating-current hysteresis loop and the squareness ratio of Br/Bl (Br: remanent magnetic flux density and Bi: magnetic flux density at a magnetic field of 1 Oe).

The value at 50 kHz was 99.4% for a magnetic core obtained by using a material having an Rf of 0.15 and 94.8% for the material having an Rf of 0.38. The difference therebetween was about 5%.

When these magnetic cores were used as saturable reactors at a power source having a switching frequency of 100 kHz, the magnetic core of the present Example obtained by using the ribbon having an Rf of 0.15 exhibited a smaller output uncontrollable range (dead angle) as compared with a comparative magnetic core obtained by using the ribbon having an Rf of 0.38. The efficiency was also improved by about 2%.

EXAMPLE B2

Ribbon samples having various surface properties were prepared from an amorphous alloy having the composition represented by the formula:

$(Co_{0.90}Fe_{0.05}Mn_{0.02}Nb_{0.03})_{71}Si_{15}B_{14}$ by a single roll method.

Figure 4:
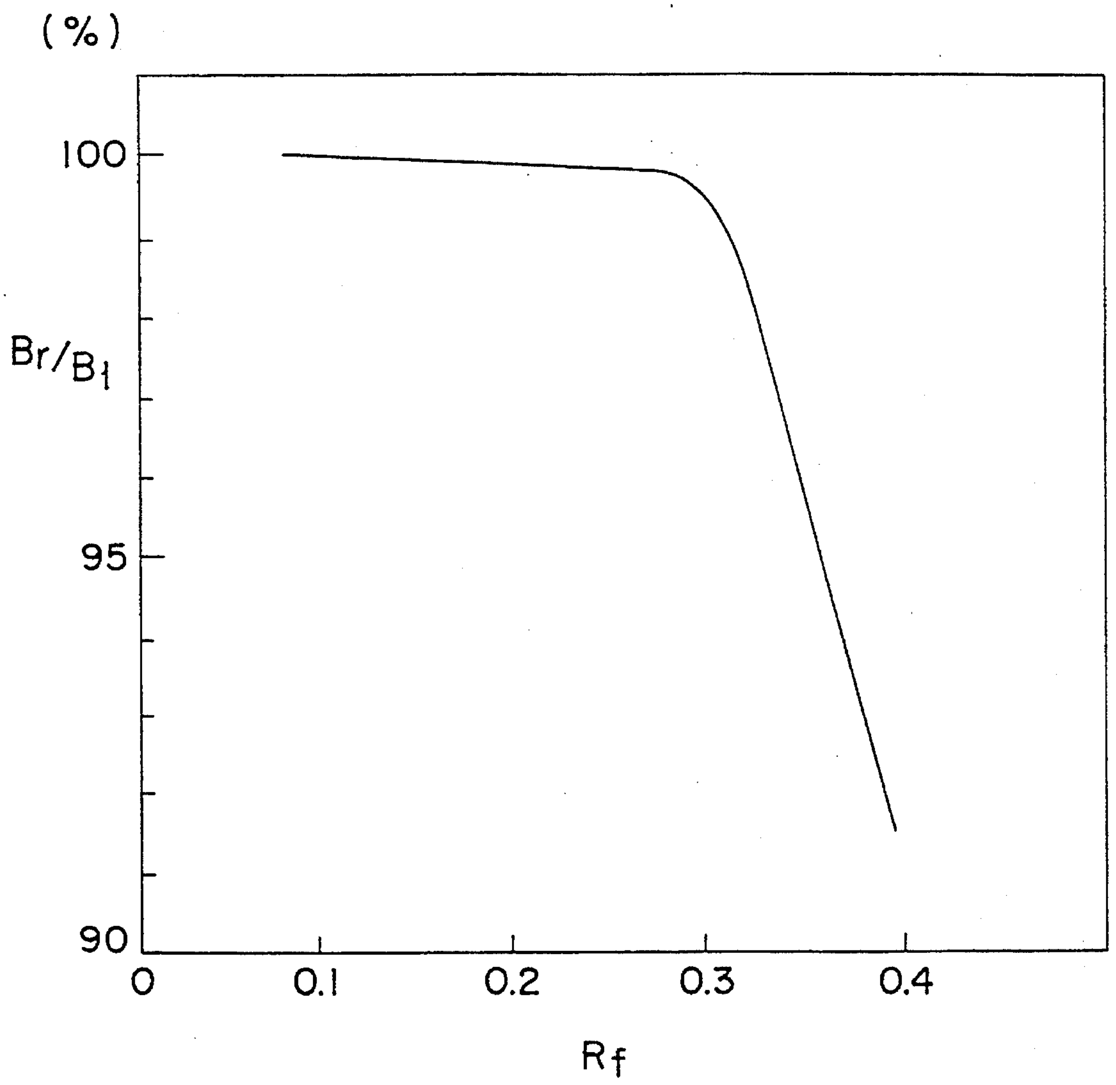
FIG. 4 is a graph showing the relationship between the surface roughness and the squareness ratio.

These materials were formed into magnetic cores as in Example B1 and the relationship between the surface roughness and squareness ratios at a frequency of 100 kHz was examined. The results are summarized in FIG. 4. It was found that when the Rf is 0.3 or more, the squareness ratio rapidly deteriorates.

EXAMPLE C1 AND COMPARATIVE EXAMPLE C1

Ribbons having a surface property such that the percent concavity occupation of the roll-contacting surface was 22% and 40% were prepared from an amorphous alloy represented by the formula:

$Fe_{74}Cu_1Nb_3Si_{13}B_9$ by a single roll method. Each ribbon was formed into a 18 mm×12 mm×4.5 mm toroidal core and heat treated for one hour at 560° C. in a $N_2$ atmosphere. Thereafter, heat treatment was carried out for 2 hours at 400° C. in a magnetic field having 5 Oe.

The squareness ratios at 100 kHz of the cores were measured as in Example A1. The squareness ratio of the magnetic core of the present invention was 98.7% and the squareness ratio of the magnetic core of the Comparative Example was 94.5%.

When these magnetic cores were used as saturable reactors at a power source having a switching frequency of 100 kHz, the magnetic core of the present Example exhibited a smaller output uncontrollable range (dead angle) as compared with a magnetic core of the Comparative Example. The power source efficiency was also improved by about 2%.

EXAMPLE A3 AND COMPARATIVE EXAMPLE A3

Ribbons having various plate thicknesses and surface properties were prepared from an amorphous alloy represented by the formula:

$$(Co_{0.90}Fe_{0.05}Mn_{0.03}Cr_{0.02})_{75}(Si_{0.6}B_{0.4})_{25}$$

under various conditions by a single roll method. These ribbons were wound into a toroidal cores each having an outer diameter of 18 mm and an inner diameter of 12 mm, heat treated for 30 minutes at 440° C. to remove strains, and heat treated for 2 hours at 200° C. in a magnetic field having 5 Oe. The resulting cores were tested for their squareness ratios at 100 kHz and core loss at 100 kHz and 2 KG as in Example A1. The plate thickness was determined as an average thickness by a gravimetric method. In this case, the average thickness can be determined by the following equation:

$$t=A/(l+w+\rho)$$

wherein l is length, w is width, A is weight and ρ is density.

The results are shown in Table 1. As can be seen from Table 1, the core obtained by using the present material having specific surface property has excellent squareness ratio, and its core loss is also low.

Figure 5:
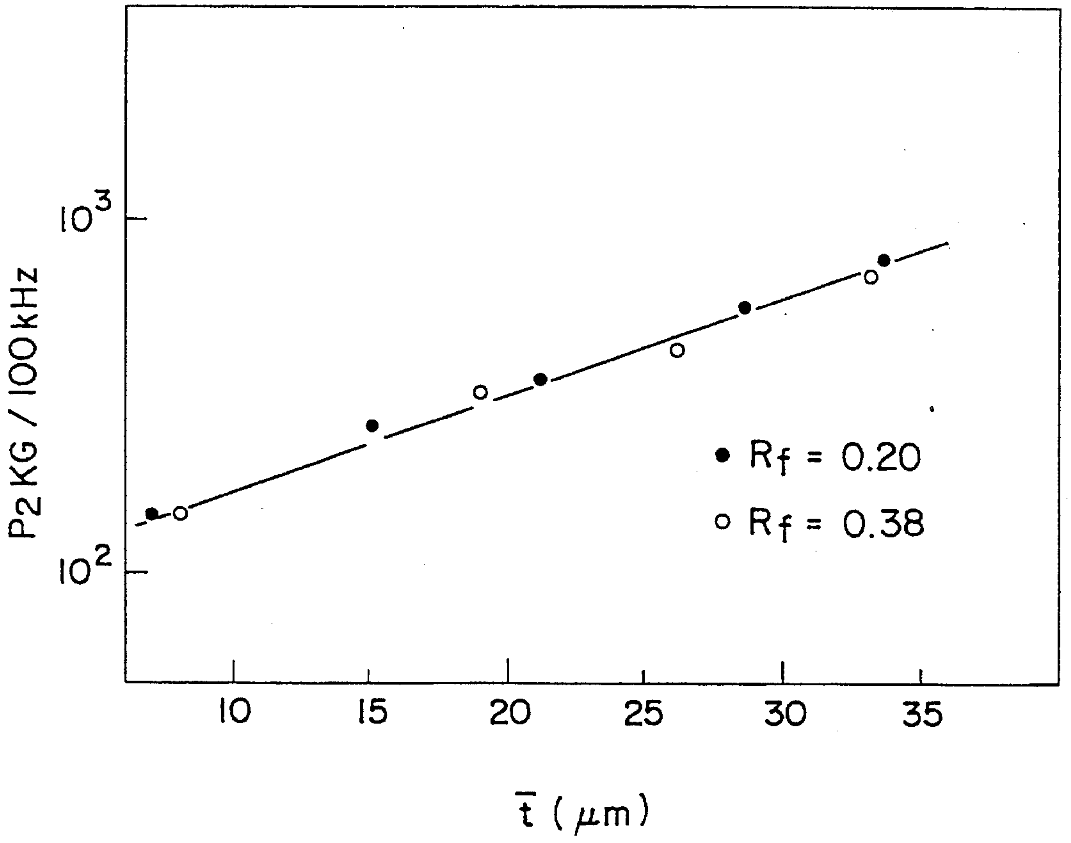
FIG. 5 is a graph showing the relationship between the plate thickness of an alloy ribbon and the core loss.

The cores having a surface roughness Rf of 0.2 and 0.38 and having various thicknesses were tested for core loss at 100 kHz. As shown in FIG. 5, the core loss gradually increases with increasing the plate thickness in spite of the surface property.

TABLE 1

| Rf | t (μm) | Br/B1 (%) | $P_{2KG}$/100 kHz |
|---|---|---|---|
| 0.22 | 21.0 | 99.5 | 350 |
| 0.34 | 18.5 | 96.4 | 340 |
| 0.24 | 28.4 | 99.0 | 560 |
| 0.36 | 28.0 | 97.0 | 520 |

EXAMPLE A4 AND COMPARATIVE EXAMPLE A4

Two ribbons were prepared from an amorphous alloy represented by the formula:

$$(Co_{0.90}Fe_{0.05}Cr_{0.1}Nb_{0.02})_{73}(Si_{0.55}B_{0.45})_{27}$$

by a single roll method. The plate thickness was 19 micrometers and the width was 5 mm. The material from which the roll used was produced and the temperature of the roll cooling water were changed to produce ribbons wherein the percent area occupied by concavities of the roll-contacting surface was 22% and 35% and the surface roughness of the free surface was 0.25 and 0.35. These ribbons were subjected to photoetching to form ring-shaped cores having an outer diameter of 8 mm and an inner diameter of 6 mm, heat treated for 40 minutes at 430° C. to remove strains, thereafter, heat treated for one hour at 200° C. in a magnetic field of 2 Oe, and laminated so that the height was 5 mm to form magnetic cores for evaluation.

The squareness ratios at 100 kHz of the cores were measured as in Example A1. The squareness ratio of the magnetic core of the present invention was 99.1% and the squareness ratio of the magnetic core of the Comparative Example was 95.2%.

These magnetic cores were used as saturable reactor cores at a power source having a switching frequency of 200 kHz, the magnetic core of the present invention exhibited a superior output control characteristic as compared with a magnetic core of the Comparative Example. The power source efficiency was also improved by about 2.5%.

EXAMPLES A5 THROUGH A20 AND C2 THROUGH C15 AND COMPARATIVE EXAMPLES A5, A6, A7, C2 AND C3

Ribbons having a width of 5 mm were prepared under production conditions shown in Table 2 by a single roll method using the composition shown in Table 2. For Co-base amorphous alloys, their Curie temperatures were also measured.

Each ribbon was wound into a toroidal magnetic core having an outer diameter of 15 mm and an inner diameter of 10 mm. The resulting Co-base amorphous magnetic core was heat treated for 30 minutes at an optimum temperature to remove strains and thereafter a magnetic field of 1 Oe was applied in the longitudinal direction of the ribbon for 2 hours at a temperature which was 30° C. below the Curie temperature to carry out heat treatment in a magnetic field. Fe-base alloys exhibited an amorphous state during the quenching process, and therefore the Fe-base alloys were heat treated for one hour at a temperature which was 50° C. above their respective crystallization temperatures (the value obtained by measuring by means of a differential scanning calorimeter at a heating rate of 10° C./minute). A magnetic field of 5 Oe was applied in the longitudinal direction of the ribbon for one hour at 450° C. to carry out heat treatment in a magnetic field. The heat treatment was carried out in a nitrogen atmosphere.

The resulting magnetic cores were tested for their squareness-ratios at 100 kHz and core loss at 100 kHz and 2 KG as in Example A1. The results are shown in Table 2. As can be seen from Table 2, excellent squareness ratio is obtained in the magnetic core of the present invention. Further, in these Examples, the magnetic flux density was determined as a value corresponding to saturation inductance. This magnetic flux density was determined by the difference between the magnetic flux density obtained by applying a magnetic field of 16 Oe at a frequency of 100 kHz under conditions such that the number of turns of the magnetic core was 10 and the remanent magnetic flux density.

TABLE 2

| Example | Alloy Composition | Tc (°C.) | Preparation Condition | Plate Thickness (μm) | Percent Occupied by Concavities of Roll-Contacting Surface (%) | Surface Roughness of Free Surface | Squareness Ratio (%) | Core Loss (ml/cc) | Magnetic Flux Density (G) |
|---|---|---|---|---|---|---|---|---|---|
| A5 | $(Co_{0.95}Fe_{0.05})_{71}(Si_{0.5}B_{0.5})_{29}$ | 235 | Fe Roll + Water Temperature 15° C. | 16.5 | 27 | 0.32 | 98.2 | 360 | 460 |
| A6 | $(Co_{0.95}Fe_{0.05})_{71}(Si_{0.6}B_{0.5})_{29}$ | 228 | Fe Roll + Water Temperature 15° C. | 15.8 | 28 | 0.35 | 98.0 | 340 | 480 |
| A7 | $(Co_{0.95}Fe_{0.05})_{72}(Si_{0.5}B_{0.5})_{28}$ | 265 | Fe Roll + Water Temperature 15° C. | 17.5 | 25 | 0.28 | 99.0 | 365 | 360 |
| A8 | $(Co_{0.95}Fe_{0.05})_{72}(Si_{0.6}B_{0.5})_{28}$ | 255 | Fe Roll + Water Temperature 15° C. | 16.8 | 24 | 0.24 | 99.0 | 370 | 380 |
| A9 | $(Co_{0.9}Fe_{0.05}Cr_{0.05})_{74}(Si_{0.6}B_{0.4})_{26}$ | 237 | Cu Roll + Water Temperature 50° C. | 19.5 | 18 | 0.17 | 99.3 | 400 | 320 |
| A10 | $(Co_{0.90}Fe_{0.05}Mo_{0.05})_{74}(Si_{0.6}B_{0.4})_{26}$ | 240 | Cu Roll + Water Temperature 40° C. | 19.2 | 24 | 0.17 | 99.0 | 400 | 340 |
| A11 | $(Co_{0.90}Fe_{0.05}Nb_{0.05})_{74}(Si_{0.6}B_{0.4})_{26}$ | 240 | Cu Roll + Water Temperature 35° C. | 19.0 | 18 | 0.14 | 99.5 | 390 | 300 |
| A12 | $(Co_{0.90}Fe_{0.05}Nb_{0.03}Cr_{0.02})_{75}(Si_{0.6}B_{0.4})_{25}$ | 220 | CuBe Roll + Water Temperature 30° C. | 18.5 | 18 | 0.23 | 99.2 | 380 | 320 |
| A13 | $(Co_{0.90}Fe_{0.05}Mo_{0.03}Cr_{0.02})_{75}(Si_{0.6}B_{0.4})_{25}$ | 225 | CuBe Roll + Water Temperature 40° C. | 20.2 | 22 | 0.20 | 99.4 | 410 | 330 |
| A14 | $(Co_{0.90}Fe_{0.05}Ta_{0.03}Cr_{0.02})_{75}(Si_{0.5}B_{0.5})_{25}$ | 225 | CuTi Roll + Water Temperature 50° C. | 19.8 | 21 | 0.22 | 99.1 | 410 | 340 |
| A15 | $(Co_{0.92}Fe_{0.03}Mo_{0.03}Mo_{0.02})_{75}(Si_{0.6}B_{0.4})_{25}$ | 218 | CuBe Roll + Water Temperature 40° C. | 15.2 | 23 | 0.16 | 99.0 | 330 | 320 |
| A16 | $(Co_{0.92}Fe_{0.03}Mo_{0.03}Nb_{0.02})_{75}(Si_{0.5}B_{0.5})_{25}$ | 220 | CuBe Roll + Water Temperature 40° C. | 15.9 | 19 | 0.18 | 99.1 | 350 | 320 |
| A17 | $(Co_{0.87}Fe_{0.07}Ni_{0.05}Nb_{0.02})_{75}(Si_{0.6}B_{0.4})_{25}$ | 300 | CuBe Roll + Water Temperature 40° C. | 16.5 | 20 | 0.20 | 99.2 | 360 | 320 |
| A18 | $(Co_{0.87}Fe_{0.07}Ni_{0.05}Mo_{0.02})_{75}(Si_{0.5}B_{0.5})_{25}$ | 305 | CuBe Roll + Water Temperature 40° C. | 17.5 | 22 | 0.22 | 99.2 | 380 | 340 |
| A19 | $(Co_{0.90}Fe_{0.05}V_{0.03}Mo_{0.02})_{75}(Si_{0.6}B_{0.4})_{25}$ | 209 | CuBe Roll + Water Temperature 40° C. | 18.5 | 20 | 0.23 | 99.3 | 400 | 350 |
| A20 | $(Co_{0.90}Fe_{0.05}Mo_{0.02}Cr_{0.03})_{75}(Si_{0.6}B_{0.4})_{25}$ | 230 | CuBe Roll + Water Temperature 40° C. | 14.2 | 7 | 0.12 | 99.8 | 290 | 260 |
| Comp. Exam. | | | Reduced Pressure of $5 \times 10^{-1}$ torr | | | | | | |
| A5 | $(Co_{0.95}Fe_{0.05})_{71}(Si_{0.5}B_{0.5})_{29}$ | 400 | Cu Roll + Water Temperature 15° C. | 20.0 | 35 | 0.38 | 94.8 | 840 | 640 |
| A6 | $(Co_{0.95}Fe_{0.05})_{71}(Si_{0.6}B_{0.5})_{29}$ | 160 | Cu Roll + Water Temperature 15° C. | 20.0 | 35 | 0.33 | 92.9 | 420 | 780 |
| A7 | $(Co_{0.95}Fe_{0.05})_{72}(Si_{0.5}B_{0.5})_{28}$ | 309 | Cu Roll + Water Temperature 12° C. | 20.0 | 35 | 0.35 | 93.5 | 440 | 700 |
| C2 | $Fe_{74}Cu_1Nb_3Si_{15}B_8$ | — | CuBe Roll + Water Temperature 40° C. | 18.5 | 22 | 0.24 | 97.1 | 460 | 460 |
| C3 | $Fe_{74}Cu_1Mo_3Si_{15}B_8$ | — | CuBe Roll + Water Temperature 40° C. | 19.7 | 28 | 0.24 | 97.0 | 490 | 480 |
| C4 | $Fe_{74}Cu_1W_3Si_{15}B_8$ | — | CuBe Roll + Water Temperature 40° C. | 21.0 | 21 | 0.28 | 97.0 | 510 | 420 |
| C5 | $Fe_{74}Au_1Ta_3Si_{15}B_8$ | — | CuBe Roll + Water Temperature 40° C. | 20.3 | 20 | 0.22 | 97.4 | 500 | 410 |
| C6 | $Fe_{70}Co_5Cu_1Ta_3Si_{14}B_8$ | — | CuBe Roll + Water Temperature 40° C. | 18.2 | 18 | 0.23 | 97.9 | 450 | 390 |
| C7 | $Fe_{70}Ni_5Cu_1Nb_3Si_{14}B_8$ | — | CuBe Roll + Water Temperature 40° C. | 17.4 | 20 | 0.32 | 97.4 | 470 | 430 |
| C8 | $Fe_{70}Ni_5Cu_1Nb_3Si_{14}B_7Cl$ | — | CuBe Roll + Water Temperature 40° C. | 19.5 | 20 | 0.30 | 96.9 | 500 | 430 |
| C9 | $FeCu_1Ru_2Nb_3Si_{14}B_8$ | — | CuBe Roll + Water Temperature 40° C. | 20.0 | 20 | 0.24 | 97.3 | 500 | 430 |
| C10 | $Fe_{73.5}Cu_{1.5}Nb_3Si_{14}B_8$ | — | CuBe Roll + Water Temperature 30° C. | 19.5 | 20 | 0.22 | 97.0 | 500 | 430 |
| C11 | $Fe_{73}Cu_1Nb_3Si_{14}B_{7.5}N_{0.5}$ | — | CuBe Roll + Water Temperature 40° C. | 16.5 | 20 | 0.25 | 97.2 | 450 | 470 |
| C12 | $Fe_{73}CuNb_3Cr_2Si_{13}B_8$ | — | CuBe Roll + Water Temperature 30° C. | 16.0 | 20 | 0.25 | 97.0 | 430 | 400 |
| C13 | $Fe_{72}Cu_{0.8}Hf_4Si_{14}B_{9.2}$ | — | CuBe Roll + Water Temperature 40° C. | 17.0 | 20 | 0.27 | 97.1 | 460 | 430 |
| C14 | $Fe_{74}Cu_1Sm_2Si_{14}B_9$ | — | CuBe Roll + Water Temperature 40° C. | 18.0 | 20 | 0.30 | 97.2 | 476 | 470 |
| C15 | $Fe_{71}Cu_{3.5}Nb_3Si_{13}B_{9.5}$ | — | CuBe Roll + Water Temperature 50° C. | 19.0 | 30 | 0.33 | 96.2 | 495 | 540 |

TABLE 2-continued

| Example | Alloy Composition | Tc (°C.) | Preparation Condition | Plate Thickness (μm) | Percent Occupied by Concavities of Roll-Contacting Surface (%) | Surface Roughness of Free Surface | Squareness Ratio (%) | Core Loss (ml/cc) | Magnetic Flux Density (G) |
|---|---|---|---|---|---|---|---|---|---|
| Comp. Exam. | | | | | | | | | |
| C2 | $Fe_{74}Cu_1Nb_3Si_{15}B_8$ | — | CuBe Roll + Water Temperature 15° C. | 19.0 | 35 | 0.33 | 93.2 | 520 | 780 |
| C3 | $Fe_{74}Cu_1Mo_3Si_{15}B_8$ | — | Cu Roll + Water Temperature 15° C. | 19.0 | 37 | 0.35 | 92.5 | 500 | 820 |

INDUSTRIAL APPLICABILITY

According to the present invention, a wound magnetic core having a high squareness and extremely excellent output control characteristic can be provided and can be widely used as a magnetic component such as a magnetic amplifier, reactor for semiconductor circuit, particularly for switching power supplies.

We claim:

1. A magnetic core formed by winding or laminating an alloy ribbon, the magnetic core having a saturation magnetic characteristic of no more than 550 G and having a squareness ratio of Br/Bl, wherein Br is remanent magnetic flux density and Bl is magnetic flux density at a magnetic field of 1 Oe, of at least 96% at a frequency of 100 kHz, the saturation magnetic characteristic being expressed by a difference between a magnetic flux density obtained by applying a magnetic field of 16 Oe to a magnetic core having an outer diameter of 15 mm and an inner diameter of 10 mm and a height of 4.5 mm, with 10 turns using a measurement frequency of 100 kHz, wherein:

the alloy ribbon comprises an alloy having at least 50.4 at % of Co or an alloy having at least 42 at % of Fe, a first surface of said alloy ribbon has a surface roughness wherein the area occupied by concavities formed on the first surface is no more than 30% of the total area of said first surface, a second surface of said alloy ribbon has a surface roughness value in the longitudinal direction of said alloy ribbon that satisfies the following equation:

$$Rf \leq 0.3,$$

wherein Rf is a parameter characterizing a roughness as determined by the equation:

$$Rf=Rz/T,$$

wherein Rz represents the average roughness of ten points at a standard length of 2.5 mm, and T represents the average plate thickness determined by the weight of the alloy ribbon.

2. The magnetic core according to claim 1, wherein said alloy ribbon comprises a Co-based or an Fe-based alloy having a Curie temperature in the range of 160° to 300° C.

3. The magnetic core according to claim 1, wherein the magnetic core has a squareness ratio of at least 98% at a frequency of 50 kHz.

4. The magnetic core according to claim 1, wherein said alloy ribbon comprises a Co-base amorphous alloy ribbon having a composition represented by the following formula:

$$(Co_{1-a}Fe_a)_{100-x}(Si_{1-l}T_l)_x,$$

wherein $$0.02 \leq a \leq 0.08,$$

$$0.3 \leq l \leq 0.8, \text{ and}$$

$$26 \leq x \leq 32 \text{ (at. \%)}.$$

5. The magnetic core according to claim 1, wherein said alloy ribbon comprises a Co-base amorphous alloy ribbon having a composition represented by the following formula:

$$(Co_{1-a}Fe_a)_{100-x}(Si_{1-l}B_l)_x,$$

wherein $$0.02 \leq a \leq 0.08,$$

$$0.3 \leq l \leq 0.8, \text{ and}$$

$$26 \leq x \leq 32 \text{ (at. \%)}.$$

6. The magnetic core according to claim 1, wherein said alloy ribbon comprises a Co-base amorphous alloy ribbon having the alloy composition represented by the following formula:

$$(Co_{1-d-e}Fe_dM'_e)_{100-z}(Si_{1-n})_z$$

wherein M' is selected from the group consisting of Ti, V, Cr, Cu, Zr, Nb, Mo, Hf, Ta, W and combinations thereof, $$0.03 \leq d \leq 0.10$$

$$0.01 \leq e \leq 0.06$$

$$0.3 \leq n \leq 0.8$$

$$24 \leq z \leq 32 \text{ (at. \%)}.$$

7. The magnetic core according to claim 1, wherein said alloy ribbon comprises a Co-based amorphous alloy ribbon having the alloy composition represented by the following formula:

$$(Co_{1-f-g-h}Fe_fM_gM'_h)_{100-w}(Si_{1-p}B_p)_w$$

wherein M is selected from the group consisting of Ni, Mn, and combinations thereof, and M' is selected from the group consisting of Ti, V, Cr, Cu, Zr, Nb, Hf, Ta, W and combinations thereof, and $$f \leq 0.10$$

$$0.01 \leq g \leq 0.10$$

$$0.01 \leqq h \leqq 0.08$$

$$0.03 \leqq p \leqq 0.5$$

$$24 \leqq w \leqq 30 \text{ (at. \%)}.$$

8. The magnetic core according to claim 1, wherein said alloy ribbon comprises an Fe-base soft magnetic alloy ribbon having the alloy composition represented by the following formula:

$$Fe_{100-e-f-g-h-i-j}E_eG_fJ_gSi_hB_iZ_j$$

wherein E represents an element selected from the group consisting of Cu, Au and combinations thereof, G represents an element selected from the group consisting of an element of the group IVa, an element of the group Va, an element of the group VI'a, rare earth elements, and combinations thereof, J represents an element selected from the group consisting of Mn, Al, Ga, Ge, In, Sn, platinum group metals and combinations thereof, Z represents an element selected from the group consisting of C, N, P and combinations thereof, and e, f, g, h, i and j are numbers satisfying the following equations:

$$0.1 \leqq e \leqq 8$$

$$0.1 \leqq f \leqq 10$$

$$0 \leqq g \leqq 10$$

$$12 \leqq h \leqq 25$$

$$3 \leqq i \leqq 12$$

$$0 \leqq j \leqq 10$$

$$15 \leqq h+i+j \leqq 30$$

wherein all figures in the equations represent atomic %.

9. The magnetic core according to claim 1, wherein the alloy ribbon is produced by ejecting an alloy melt onto the surface of a cooling roll by means of an ejecting nozzle and quenching the alloy melt, the first surface of said alloy ribbon being defined as the surface that comes into contact with said cooling roll, and the second surface being defined as the surface that does not come into contact with said cooling roll.

* * * * *